(12) United States Patent
Kurunczi et al.

(10) Patent No.: US 7,812,321 B2
(45) Date of Patent: Oct. 12, 2010

(54) TECHNIQUES FOR PROVIDING A MULTIMODE ION SOURCE

(75) Inventors: Peter Kurunczi, Cambridge, MA (US);
Rajesh Dorai, Woburn, MA (US);
Costel Biloiu, Rockport, MA (US);
Wilhelm Platow, Somerville, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 254 days.

(21) Appl. No.: 12/137,225

(22) Filed: Jun. 11, 2008

(65) Prior Publication Data

US 2009/0309041 A1    Dec. 17, 2009

(51) Int. Cl.
*H01J 27/00* (2006.01)
*H01J 27/24* (2006.01)
*H01T 23/00* (2006.01)

(52) U.S. Cl. .............. 250/424; 250/492.21; 250/423 R; 250/423 F; 250/426

(58) Field of Classification Search .............. None
See application file for complete search history.

(56) References Cited

U.S. PATENT DOCUMENTS

| | | | | | |
|---|---|---|---|---|---|
| 5,517,084 | A | * | 5/1996 | Leung | 315/111.81 |
| 5,581,156 | A | * | 12/1996 | Roberts et al. | 315/111.81 |
| 5,661,308 | A | * | 8/1997 | Benveniste et al. | 250/492.21 |
| 5,861,630 | A | * | 1/1999 | Becker | 250/423 R |
| 6,288,403 | B1 | * | 9/2001 | Horsky et al. | 250/427 |
| 6,803,585 | B2 | * | 10/2004 | Glukhoy | 250/423 R |
| 6,958,481 | B2 | * | 10/2005 | Horsky et al. | 250/427 |
| 7,022,999 | B2 | * | 4/2006 | Horsky et al. | 250/427 |
| 7,064,491 | B2 | * | 6/2006 | Horsky et al. | 315/111.81 |
| 7,586,109 | B2 | * | 9/2009 | Perel et al. | 250/492.21 |
| 7,655,931 | B2 | * | 2/2010 | Gupta | 250/492.21 |
| 2003/0079688 | A1 | | 5/2003 | Walther | |
| 2008/0179545 | A1 | * | 7/2008 | Perel et al. | 250/492.21 |
| 2008/0237496 | A1 | * | 10/2008 | Gupta | 250/492.21 |
| 2008/0302955 | A1 | * | 12/2008 | Dzengeleski et al. | 250/252.1 |
| 2009/0166554 | A1 | * | 7/2009 | Radovanov et al. | 250/424 |
| 2009/0309041 | A1 | * | 12/2009 | Kurunczi et al. | 250/423 R |
| 2009/0314951 | A1 | * | 12/2009 | Biloiu et al. | 250/423 R |
| 2009/0314962 | A1 | * | 12/2009 | Dorai et al. | 250/492.21 |
| 2010/0055345 | A1 | * | 3/2010 | Biloiu et al. | 427/569 |

FOREIGN PATENT DOCUMENTS

JP      60-253138 A     12/1985
JP      2006-107974 A   4/2006

OTHER PUBLICATIONS

Wells, D.K., "A Small Cold Cathode High Intensity Cyclotron Ion Source" *IEEE Tranactions on Nuclear Science*, Jun. 1967, pp. 70-71.
Yushkov, George Yu et al, "Meeva Ion Source Operated in Purely Gaseous Mode", *Review of Scientific Instruments*, vol. 75, No. 5, May 2004, pp. 1582-1584.
Zhizhong, Song et al., "A Slit-End Extraction Penning Ionization Gauge Ion Source with a Permanent Magnet", *Review of Scientific Instruments*, vol. 73, No. 2, Feb. 2002, pp. 852-853.

* cited by examiner

*Primary Examiner*—David A Vanore

(57) ABSTRACT

Techniques for providing a multimode ion source are disclosed. In one particular exemplary embodiment, the techniques may be realized as an apparatus for ion implantation comprising an ion source that operates in multiple modes such that a first mode is an arc-discharge mode and a second mode is an RF mode.

12 Claims, 4 Drawing Sheets

US 7,812,321 B2

TECHNIQUES FOR PROVIDING A MULTIMODE ION SOURCE

FIELD OF THE DISCLOSURE

The present disclosure relates generally to semiconductor manufacturing equipment and, more particularly, to techniques for providing a multimode ion source.

BACKGROUND OF THE DISCLOSURE

Ion implantation is a process of depositing chemical species into a substrate by direct bombardment of the substrate with energized ions. In semiconductor manufacturing, ion implanters are used primarily for doping processes that alter the type and level of conductivity of target materials. A precise doping profile in an integrated circuit (IC) substrate and its thin-film structure is often crucial for proper IC performance. To achieve a desired doping profile, one or more ion species may be implanted in different doses and at different energy levels.

FIG. 1 depicts a conventional ion implanter system 100. The ion implanter system 100 may comprise an ion source 102 and a complex series of components through which an ion beam 10 passes. The series of components may include, for example, an extraction manipulator 104, a filter magnet 106, an acceleration or deceleration column 108, an analyzer magnet 110, a rotating mass slit 112, a scanner 114, and a corrector magnet 116. Much like a series of optical lenses that manipulate a light beam, the ion implanter components can filter and focus the ion beam 10 before steering it towards a target wafer 120 (located in a wafer plane 12). A number of measurement devices, such as a dose control Faraday cup 118, a traveling Faraday cup 124, and a setup Faraday cup 122, may be used to monitor and control the ion beam conditions.

The ion source 102 is a critical component of the ion implanter system 100. The ion source 102 is required to generate a stable and reliable ion beam 10 for a variety of different ion species and extraction voltages.

FIG. 2 depicts a typical embodiment of an ion source 200 that may be used in the ion implanter system 100. The ion source 200 may be an inductively heated cathode (IHC) ion source, which is typically used in high current ion implantation equipment. The ion source 200 comprises an arc chamber 202 with conductive chamber walls 214. At one end of the arc chamber 202 there is a cathode 206 having a tungsten filament 204 located therein. The tungsten filament 204 is coupled to a first power supply 208 capable of supplying a high current. The high current may heat the tungsten filament 204 to cause thermionic emission of electrons. A second power supply 210 may bias the cathode 206 at a much higher potential than the tungsten filament 204 to cause the emitted electrons to accelerate towards and heat the cathode 206. Heating the cathode 206 causes the cathode 206 to emit thermionic electrons into the arc chamber 202. A third power supply 212 may bias the chamber walls 214 with respect to the cathode 206 so that the electrons are accelerated at a high energy into the arc chamber. A source magnet (not shown) may create a magnetic field B inside the arc chamber 202 to confine the energetic electrons, and a repeller 216 at the other end of the arc chamber 202 may be biased at a same or similar potential as the cathode 206 to repel the energetic electrons. A gas source 218 may supply a precursor implant species (e.g., $AsH_4$, $PH_4$, $BF_3$, $GeF_4$) into the arc chamber 202. The energetic electrons may interact with the precursor implant species to produce a plasma 20. An extraction electrode (not shown) may then extract ions 22 from the plasma 20 through an extraction aperture 220 for use in the ion implanter 100.

A problem that currently exists in conventional ion implantation is that ion implanters that are typically designed for efficient operation at relatively high implant energies (e.g., 10's kV) may not function efficiently at lower energies (e.g., sub-kV). One application, for example, which utilizes low-energy dopant beams is the formation of ultra-shallow transistor junctions in CMOS (complimentary metal-oxide semiconductor) manufacturing. Specifically, implantation of low-energy boron, a p-type dopant, into silicon wafers is particularly important.

This inefficiency at lower energies is generally caused by space charge limitations. The Child-Langmuir relation, $J \sim (Z/A)^{1/2} V^{3/2}/d^2$, describes the current density limit of a space charge dominated beam. Here, an ion beam's current density limit J scales proportionally to the square root of a charge to mass ratio (Z/A) and to the three-halves power of extraction potential V. Thus, at lower beam energies (e.g., lower extraction potential V), less ion current density may be obtained when compared to extraction of the same species at higher energies.

For example, space charge in low energy beams tends to cause the beam cross-section area ("profile") to grow larger as ions proceed along the beam line ("beam blow-up"). When the beam profile exceeds the profile for which the implanter's transport optics have been designed, beam loss through vignetting occurs. For instance, at 500 eV transport energy, conventional ion implanters typically cannot transport adequate boron beam current for efficient commercial manufacturing. Wafer throughput is reduced because of low implantation dose rate.

One method to overcome the space charge limitation of low energy beams is to implant the required dopant in its molecular form. For example, U.S. patent application Ser. Nos. 11/504,355 and 11/342,183, which are hereby incorporated by reference in their entirety, describe a method of molecular ion implantation and specifically implantation of $C_2B_{10}Hx$ ions generated from $C_2B_{10}H_{12}$ (carborane). Molecular ion implantation allows the use of higher extraction energies to achieve the equivalent implant depth as obtained from a low energy atomic ion implant. The relationship between the higher molecular extraction energy and the equivalent atomic implant depth may be expressed by:

$$E_{molecule} = (\text{molecule mass/atomic mass}) \times E_{equivalent},$$

where $E_{molecule}$ is the energy of the molecular ion and $E_{equivalent}$ is the implant energy required to achieve the desired implant depth using an atomic ion only. For example, instead of implanting an ion current I of atomic $B^+$ ions at an energy E, a carborane molecular ion ($C_2B_{10}H_{12}^+$) for example, may be implanted at an energy approximately 13×E and at an ion current of 0.10×I. Although the resulting implantation depth and dopant concentration (dose) of both approaches have been shown to be generally equivalent, the molecular implantation technique may have significant potential advantages. For example, since the transport energy of the carborane ion is thirteen times that of a dose-equivalent boron ion and the carborane current is one-tenth that of the boron current, space charge forces may be substantially reduced when compared to monatomic boron implantation.

However, conventional ion implanters utilizing an IHC ion source 102 are relatively inefficient at producing large molecular ions. For example, while $BF_3$ gas is typically used by conventional ion sources to generate $B^+$ ions, carborane ($C_2B_{10}H_{14}$) must be used to generate the carborane ion $C_2B_{10}H_x^+$. Carborane is a solid material which has a significant vapor pressure, on the order of 1 Torr at 20° C., melts at 100° C., and decomposes at 750° C. For efficient production of $C_2B_{10}H_x^+$, carborane must be vaporized below 100° C. and must operate in an ion source whose local environment (e.g., chamber wall and chamber components) is below 750° C. to avoid decomposition of the majority of the vaporized molecules. However, the operating temperatures of IHC sources are typically 800° C. to 2300° C. from the chamber body to the heated button cathode. While these temperatures are required for the thermal dissociation of $BF_3$ and subsequent $B^+$ ion creation, they are not conducive for the production carborane ions that can be readily dissociated by the high operating temperatures. In addition, such extremely high temperatures shorten the performance and lifetime of IHC ion sources. As a result, the performance degradation and short lifetime of IHC ion sources greatly reduce the productivity of ion implanters.

Furthermore, ion source vaporizers typically cannot operate reliably at the lower temperatures required for carborane, due to radiative heating from the ion source to the vaporizer. For example, vaporizer feed lines may easily become clogged with deposits from decomposed vapor as the carborane vapor interacts with their hot surfaces. Hence, conventional ion sources are incompatible with carborane ion implantation.

In view of the foregoing, it may be understood that there are significant problems and shortcomings associated with current ion source technologies.

SUMMARY OF THE DISCLOSURE

Techniques for providing a multimode ion source are disclosed. In one particular exemplary embodiment, the techniques may be realized as an apparatus for ion implantation comprising an ion source that operates in multiple modes such that a first mode is an arc-discharge mode and a second mode is an RF mode.

In accordance with other aspects of this particular exemplary embodiment, the apparatus may further comprise a switch for switching between the multiple modes.

In accordance with further aspects of this particular exemplary embodiment, the apparatus may further comprise an RF power supply and an RF matching network for operating the ion source in the RF mode.

In accordance with additional aspects of this particular exemplary embodiment, the ion source may generate a plasma based on at least one of diborane, pentaborane, carborane, octaborane, decaborane, boron, arsenic, phosphorus, indium, germanium, and carbon.

In accordance with other aspects of this particular exemplary embodiment, the apparatus may further comprise a cathode, a repeller, and a first additional electrode to provide greater electrode area.

In accordance with further aspects of this particular exemplary embodiment, the apparatus may further comprise a cathode, a repeller, a first additional electrode, and a second additional electrode to provide greater electrode area.

In another particular exemplary embodiment, the techniques may be realized as a multi-mode ion source comprising a chamber that supports multiple modes of operation such that a first mode of operation is an arc-discharge mode and a second mode of operation is an RF mode.

In accordance with other aspects of this particular exemplary embodiment, the multi-mode ion source may further comprise a switch for switching between the multiple modes.

In accordance with further aspects of this particular exemplary embodiment, the multi-mode ion source may further comprise an RF power supply and an RF matching network for operating the ion source in the RF mode.

In accordance with additional aspects of this particular exemplary embodiment, the multi-mode ion source may generate a plasma based on at least one of diborane, pentaborane, carborane, octaborane, decaborane, boron, arsenic, phosphorus, indium, germanium, and carbon.

In accordance with other aspects of this particular exemplary embodiment, the multi-mode ion source may further comprise a cathode, a repeller, and a first additional electrode to provide greater electrode area.

In accordance with further aspects of this particular exemplary embodiment, the multi-mode ion source may further comprise a cathode, a repeller, a first additional electrode, and a second additional electrode to provide greater electrode area.

In another particular exemplary embodiment, the techniques may be realized as a method for ion implantation in multiple modes comprising providing a first mode of operation of an ion source based on an arc-discharge mode, providing a second mode of operation of the ion source based on an RF mode, and switching between the first mode and the second mode using at least one switch.

In accordance with other aspects of this particular exemplary embodiment, the ion source may comprise a switch for switching between the multiple modes.

In accordance with further aspects of this particular exemplary embodiment, the ion source may comprise an RF power supply and an RF matching network for operating the ion source in the RF mode.

In accordance with additional aspects of this particular exemplary embodiment, the ion source may generate a plasma based on at least one of diborane, pentaborane, carborane, octaborane, decaborane, boron, arsenic, phosphorus, indium, germanium, and carbon.

In accordance with other aspects of this particular exemplary embodiment, the ion source may comprise a cathode, a repeller, and a first additional electrode to provide greater electrode area.

In accordance with further aspects of this particular exemplary embodiment, the ion source may comprise a cathode, a repeller, a first additional electrode, and a second additional electrode to provide greater electrode area.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Embodiments of the present disclosure improve upon the above-described techniques by providing a multimode ion source for greater molecular ion implantation as well as increased ion source performance and lifetime over conventional ion source technologies. In addition, embodiments of the present disclosure provide various exemplary ion source configurations.

Figure 1:
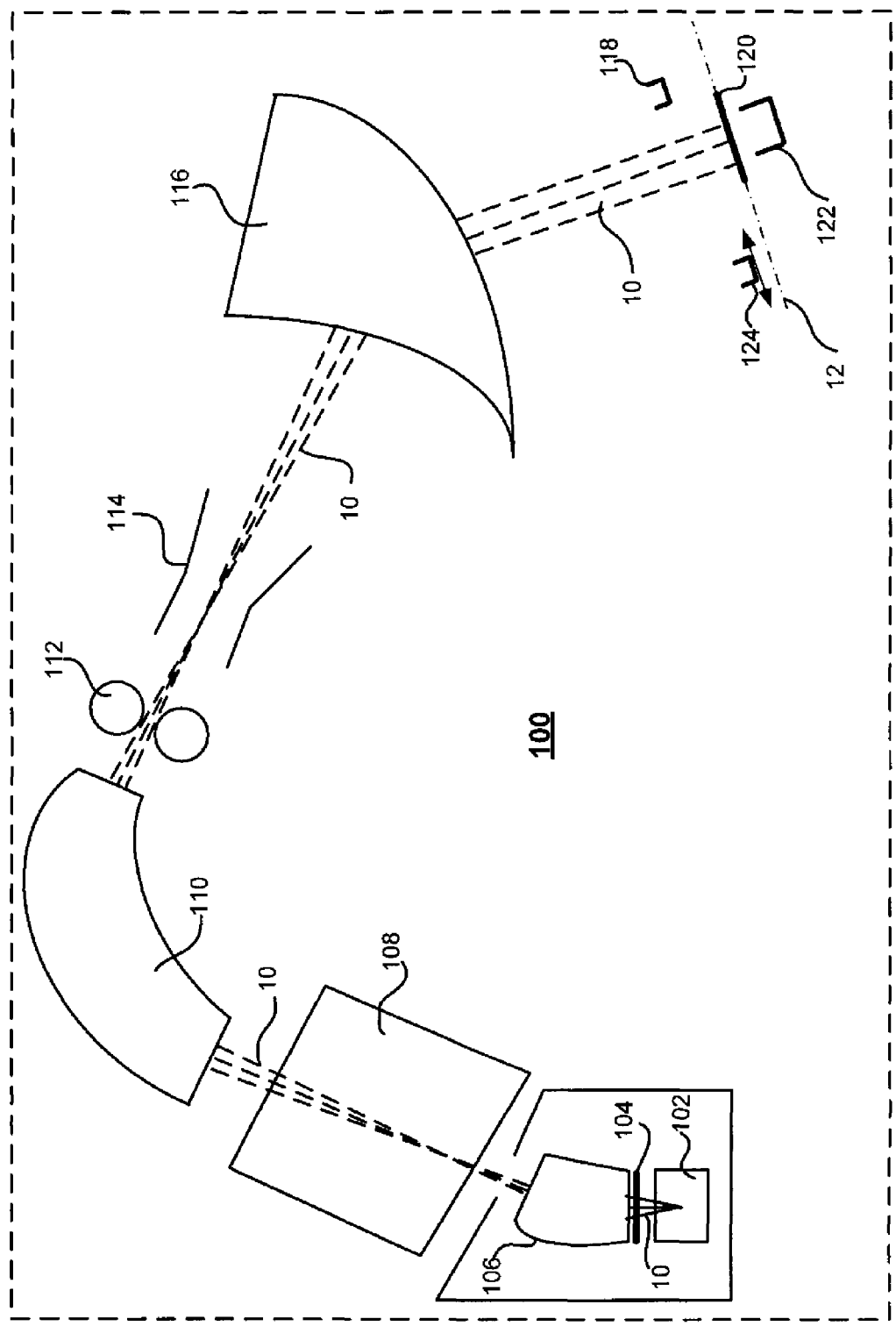
FIG. 1 depicts a conventional ion implanter system.
Figure 2:
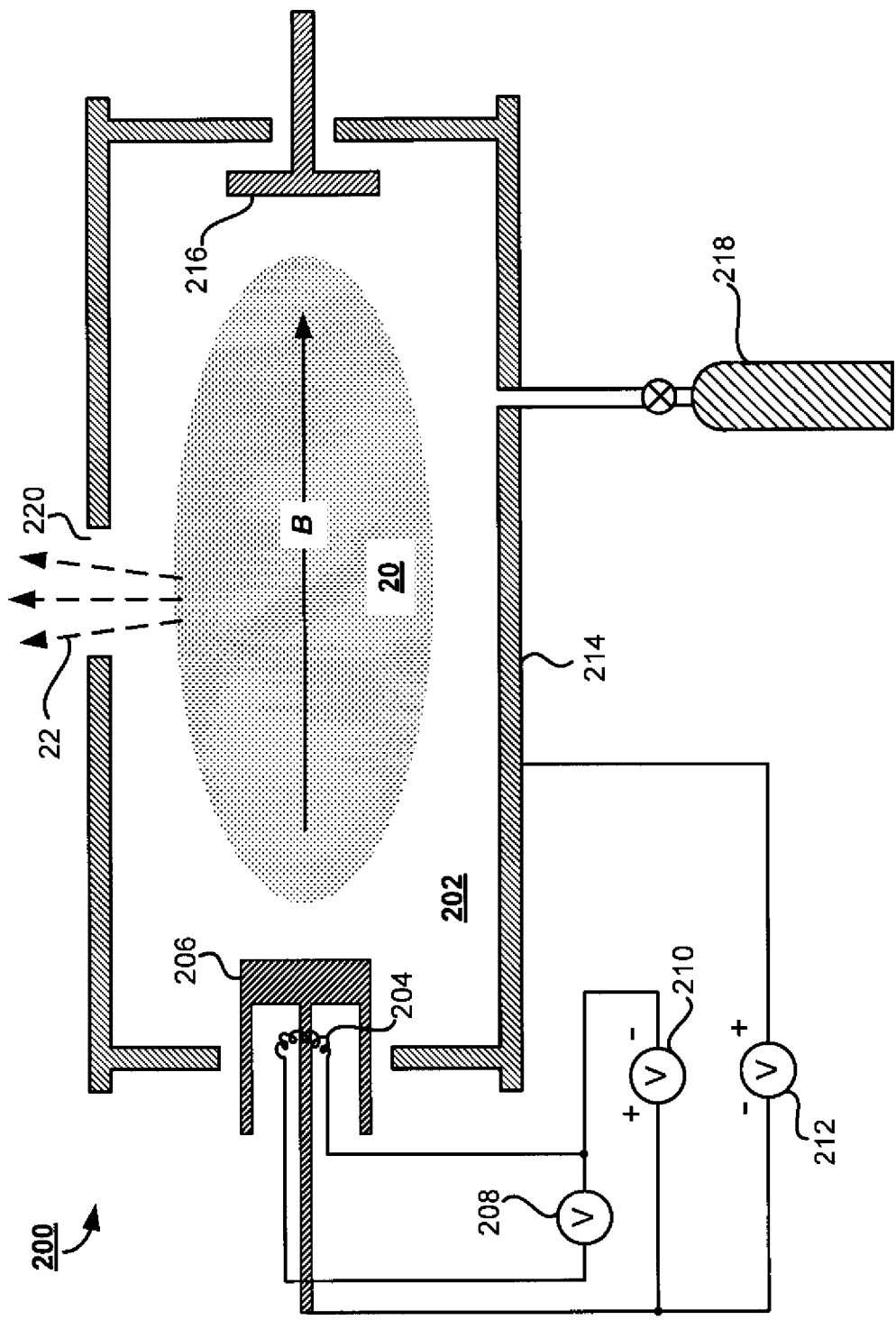
FIG. 2 depicts a conventional ion source.
Figure 3:
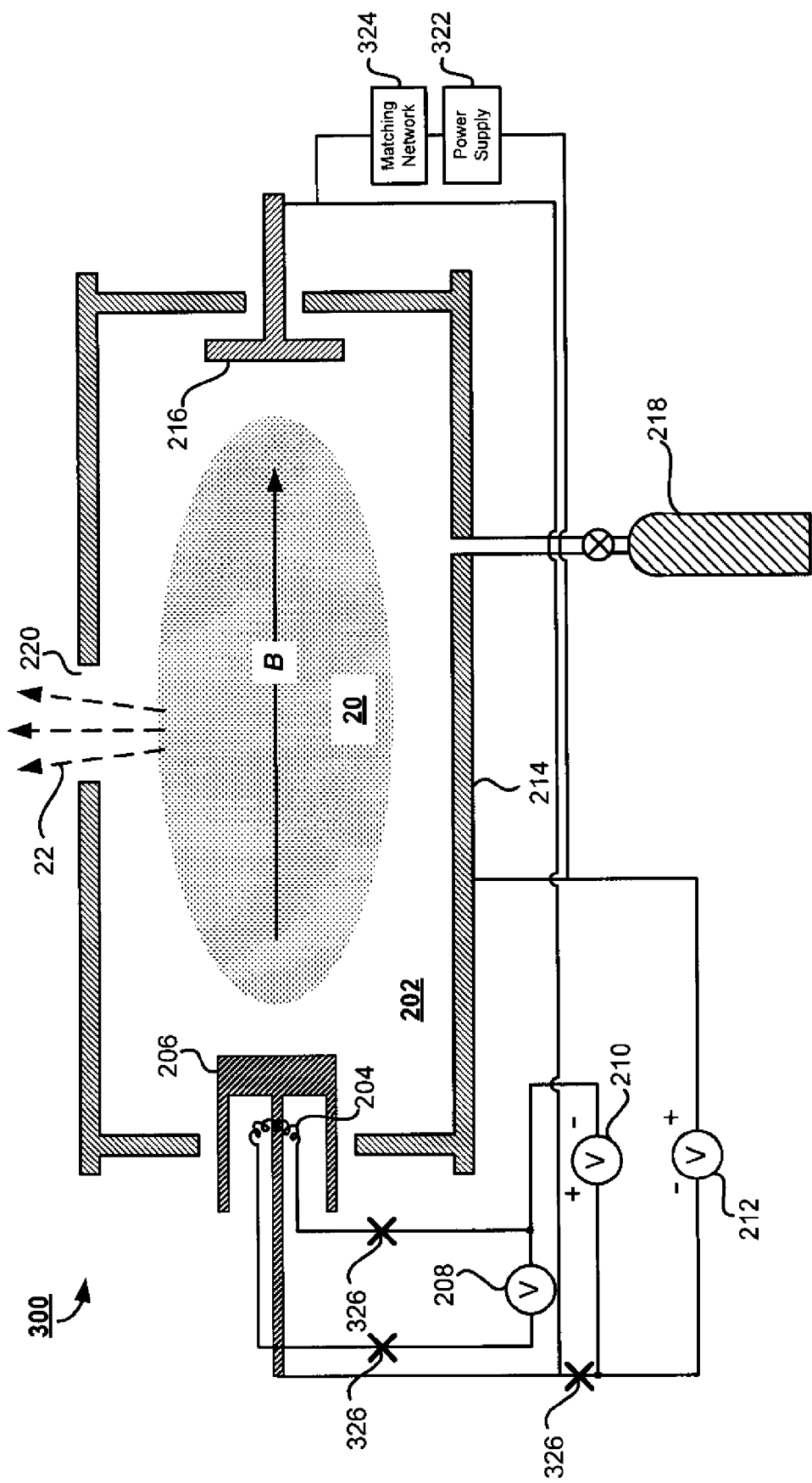
FIG. 3 depicts a multimode ion source according to an embodiment of the present disclosure.

Referring to FIG. 3, a multimode ion source 300 is shown in accordance with an embodiment of the present disclosure. For example, in one embodiment, the multimode ion source 300 may have several modes of operation. These may include at least an arc-discharge mode (e.g., an inductively heated cathode (IHC) mode) and a non-arc-discharge mode (e.g., a radio frequency (RF) mode). Other various modes of operation may also be provided, including other indirect or high frequency modes of operation. Similar to the ion source 200 of FIG. 2, the multimode ion source 300 of FIG. 3 may include an arc chamber 202 with conductive chamber walls 214. At one end of the arc chamber 202 there may be a cathode 206 having a tungsten filament 204 located therein. The tungsten filament 204 may be coupled to a first power supply 208 capable of supplying a high current. The high current may heat the tungsten filament 204 to cause thermionic emission of electrons. A second power supply 210 may bias the cathode 206 at a much higher potential than the tungsten filament 204 to cause the emitted electrons to accelerate towards and heat the cathode 206. Heating the cathode 206 may cause the cathode 206 to emit electrons into the arc chamber 202. A third power supply 212 may bias the chamber walls 214 with respect to the cathode 206 so that the electrons are accelerated at a high energy into the arc chamber. A source magnet (not shown) may create a magnetic field B inside the arc chamber 202 to confine the energetic electrons, and a repeller 216 at the other end of the arc chamber 202 may be biased at a same or similar potential as the cathode 206 to repel the energetic electrons. A gas source 218 may supply a precursor ion implant species (e.g., $AsH_4$, $PH_4$, $BF_3$, carborane ($C_2B_{10}H_{12}$)) into the arc chamber 202. The energetic electrons may interact with the precursor ion implant species to produce a plasma 20. An extraction electrode (not shown) may then extract ions 22 from the plasma 20 through extraction aperture 220 for use in the ion implanter 100.

However, unlike FIG. 2, the multimode ion source 300 may also include an additional power supply 322 and a matching network 324. In one embodiment, the additional power supply 322 may be a radio frequency (RF) power supply placed within the ion source circuitry. For example, the RF power supply 322 may be placed in parallel with the IHC arc chamber power supply 212. Furthermore, the RF power supply 322 may also be placed in the same power rack (not shown) as the IHC power supplies. The matching network 324 may be an RF matching network that is coupled to the RF power supply 322. In one embodiment, the RF matching network 324 may be positioned relatively near to the repeller 216 (or flange) of the multimode ion source 300. The RF power supply 322 and the matching network 324 may further be coupled to IHC powers supplies 208, 210, and 212 by switches 326 to enable "pushbutton" conversion between the two ion source modes.

In an IHC mode of operation, for example, switches 326 may be "closed" to enable power supplies 208, 210, and 212. Accordingly, the multimode ion source 300 may function as an arc mode ion source using the IHC filament 204, bias (wires/circuitry), and power supplies 208, 210, and 212 to provide typical ion implantation. It should be appreciated that the matching network 234 may remain connected to the IHC power supplies 208, 210, and 212 and circuitry since DC currents from the IHC power supplies 208, 210, and 212 may be effectively blocked by high-pass tuning capacitors in the matching network 234.

In an RF mode of operation, for example, the multimode ion source 300 may operate as a capacitively coupled plasma (CCP) source. In this example, the power supplies 208, 210, and 212 may be disconnected from the multimode ion source 300. In one embodiment, disconnecting power supplies 208, 210, and 212 may be achieved remotely through an energized relay. In another embodiment, such disconnecting may be provided by one or more local switches 326. Other various blocking techniques may also be provided. Once the IHC components are effectively blocked (or disconnected) and the switches 326 are "opened," the additional power supply 322 may be "connected" to both the cathode 206 and the repeller 216 to enable the multimode ion source 300 to function as a CCP source for enhanced molecular ion implantation.

It should be appreciated that plasma parameters may be adjusted by altering the gas flow at the gas source 218, the applied magnetic fields (not shown), the applied RF power and frequency, and other various components. Furthermore, it should be appreciated that since a Paschen minimum typically occurs when high pressure exists within the arc chamber 202, hardly any unwanted "stray" plasma formation may be expected elsewhere in the multimode ion source 300.

Plasma densities from the multimode ion source 300 operating in RF mode may range from $1e^{10}$ to $1e^{11}$ cm$^{-3}$. At higher densities, e.g., $\sim 1e^{11}$ cm$^{-3}$, a corresponding ion flux may be 0.75 mA/cm$^2$ for 120 amu. Thus, assuming an ion fraction of 50% $C_2B_{10}H_x^+$, this may translate into 1 mA of $C_2B_{10}H_x^+$ ion current from a 55 mm×5 mm extraction aperture 220.

A particular characteristic of the multimode ion source 300 operating in RF CCP mode may be that plasma densities scale as the square of the applied frequency, e.g., $n\sim\omega^2$. As a result, operating at higher frequencies may enable larger ion flux. In application, higher plasma densities of approximately $1e^1$ cm$^{-3}$ may be achieved with the RF power supply 322 operating at approximately 40 MHz or higher. Furthermore, use of a source magnet (not shown) may help achieve higher plasma densities. Therefore, the multimode ion source 300, in accordance with at least one embodiment of the present disclosure, may potentially produce molecular beam currents of approximately 1 mA using a wide variety of species and with minimized amounts of source life reducing deposits.

In addition to the configuration of the multimode ion source 300 shown in FIG. 3, other various configurations may also be provided. For example, additional RF electrodes may be included.

Figure 4B:
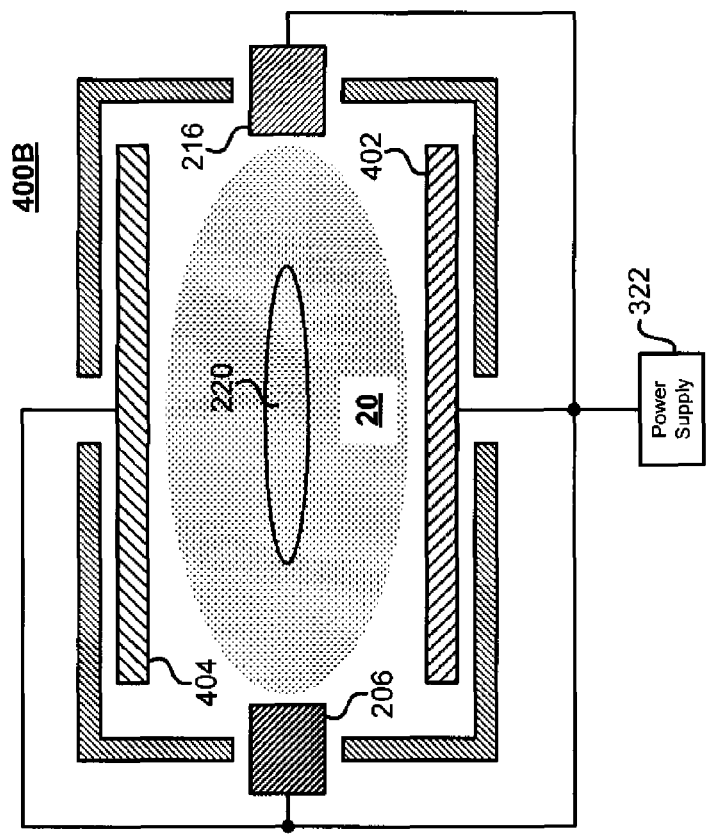
FIG. 4B depicts a multimode ion source according to an alternative embodiment of the present disclosure.
Figure 4A:
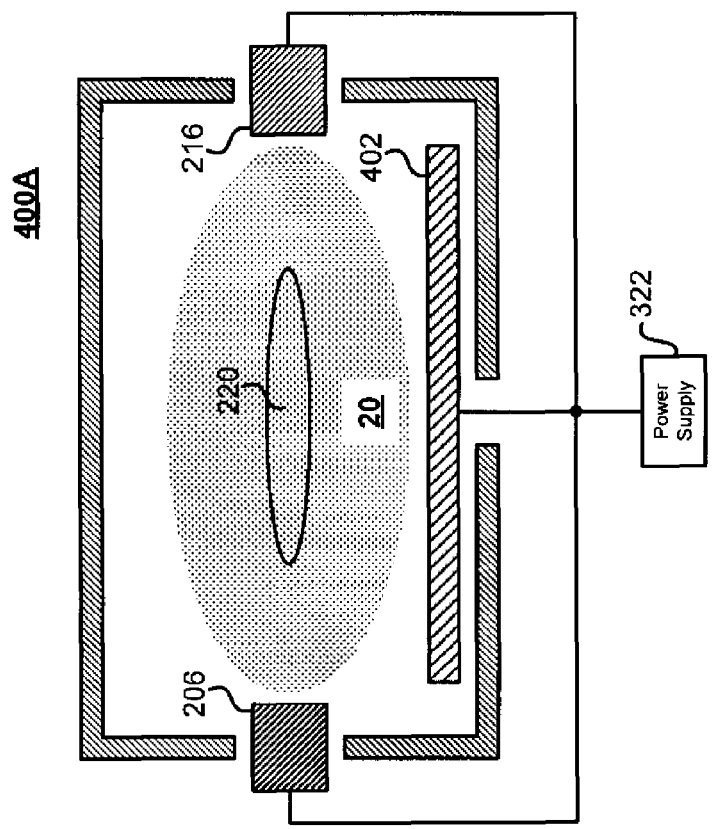
FIG. 4A depicts a multimode ion source according to an alternative embodiment of the present disclosure.

FIG. 4A depicts a different view of a multimode ion source 400A according to an alternative embodiment of the present disclosure. In this example, the multimode ion source 400A may include a first additional electrode 402. Similar to the cathode 206 and the repeller 216, the first additional electrode 402 may also be coupled to the additional power supply 322 (e.g., RF power supply).

FIG. 4B depicts a different view of a multimode ion source 400B according to an alternative embodiment of the present disclosure. In this example, the multimode ion source 400B may include the first additional electrode 402 as well as a second addition electrode 404. Similar to the cathode 206 and the repeller 216, the first additional electrode 402 and the second additional electrode 404 may also be coupled to the additional power supply 322 (e.g., RF power supply).

Each of the first additional electrode 402 and the second additional electrode 404 may be similar to existing electrodes (e.g., cathode 206 and repeller 216). However, in one embodiment, the first additional electrode 402 and the second additional electrode 404 may be larger in area. Other various geometrical shapes and dimensions may also be provided.

Having these extra electrodes (e.g., the first additional electrode 402 and/or the second additional electrode 404) in a multimode ion source 400A, 400B may allow the plasma to be exposed to more electrode area when operating in an RF mode. This increase in electrode area may provide a larger applied power density to the source volume and higher molecular beam currents. Additionally, a more uniform plasma may form across the entire length of the extraction aperture 220.

Also, as depicted in FIG. 4B, the confining effect of the four RF electrodes (e.g., the cathode 206, the repeller 216, the first additional electrode 402, and the second additional electrode 404) may allow the multimode ion source 400B to operate in a hollow cathode discharge mode.

Capacitively-coupled electrodes, such as the first additional electrode 402 and/or the second additional electrode 404, may also acquire a negative self DC bias. This negative bias may confine plasma electrons within a discharge volume and subsequently increase ionization rates and plasma densities.

It should be appreciated that when the multimode ion sources of FIGS. 4A and 4B are not being operated in an RF mode or other high frequency mode, the first additional electrode 402 and/or the second additional electrode 404 may be grounded.

It should be appreciated that while embodiments of the present disclosure are directed to multimode ion sources that operate in an inductively heated cathode (IHC) mode and a radio frequency (RF) mode, other various modes of operation may be provided as well. These may include other arc-discharge and non-arc-discharge modes of operation, such as hollow cathode discharge mode, inductively coupled plasma mode, microwave plasma mode, cold plasma cathode mode, etc.

It should also be appreciated that while embodiments of the present disclosure are described using carborane, other implantation species may also be provided. For example, gases such as diborane, pentaborane, decaborane, and octadecaborane, may be used to generate a molecular ion beam. In addition gases such as arsine, phosphine, vaporized indium halides, germanium halides (e.g. $GeF_3$), and boron halides (e.g., $BF_3$, $BCl_3$) may also be used to generate atomic and/or molecular ions.

It should also be appreciated that the disclosed embodiments not only provide several modes of operation, but that these various modes may provide additional implantation customizations that would not otherwise readily be provided. For example, a single multimode ion source may be configured to operate in various modes in a particular sequence (e.g., a specific implantation recipe). As a result, using several modes of operation, in addition to using various molecular ions and/or atomic ions in this process, may provide a customized ion implantation sequence that is tailored to any specific implantation need of a particular user. Other various embodiments may also be provided.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. An apparatus for ion implantation, the apparatus comprising:
    an ion source that operates in multiple modes, wherein a first mode is an arc-discharge mode and a second mode is an RF mode
    an RF power supply;
    a cathode;
    a repeller; and
    a first additional electrode, wherein the cathode, the repeller, and the first additional electrode are connected to the RF power supply.

2. The apparatus of claim 1, further comprising a switch for switching between the multiple modes.

3. The apparatus of claim 1, further comprising an RF matching network for operating the ion source in the RF mode.

4. The apparatus of claim 1, further comprising a gas source configured to supply at least one of diborane, pentaborane, carborane, octadecaborane, decaborane, boron, arsenic, phosphorus, indium, germanium, and carbon.

5. The apparatus of claim 1, further comprising a second additional electrode to provide greater electrode area, wherein the second additional electrode is connected to the RF power supply.

6. A mull-mode ion source, the ion source comprising:
    a chamber that supports multiple modes of operation, wherein a first mode of operation is an arc-discharge mode and a second mode of operation is an RF mode;
    an indirectly heated cathode comprising a filament and a cathode;
    a repeller; and
    an RF power supply and an RF matching network, wherein the RF power supply is connected to the cathode and the repeller.

7. The ion source of claim 6, further comprising a switch for switching between the multiple modes of operation.

8. The ion source of claim 6, further comprising a gas configured to supply at least one of diborane, pentaborane, carborane, octadecaborane, decaborane, boron, arsenic, phosphorus, indium, germanium, and carbon.

9. The ion source of claim 6, further comprising a first additional electrode to provide greater electrode area.

10. The ion source of claim 6, further comprising a first additional electrode and a second additional electrode to provide to provide greater electrode area.

11. A method for ion implantation in multiple modes, the method comprising:
    supplying a current to a filament in an indirectly heated cathode comprising the filament and a cathode whereby the filament and the cathode operate in an arc discharge mode;

disconnecting the current to the filament; and supplying RF power to a repeller and the cathode whereby the repeller and the cathode operate as a capacitively coupled plasma source.

12. The method of claim 11, further comprising generating a plasma based on at least one of diborane, pentaborane, carborane, octadecaborane, decaborane, boron, arsenic, phosphorus, indium, germanium, and carbon.

* * * * *